United States Patent
Sobue

(10) Patent No.: US 7,893,656 B2
(45) Date of Patent: Feb. 22, 2011

(54) SEMICONDUCTOR INTEGRATED CIRCUIT DEVICE FOR MONITORING CELL VOLTAGES

(75) Inventor: Satoshi Sobue, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 682 days.

(21) Appl. No.: 11/907,635

(22) Filed: Oct. 16, 2007

(65) Prior Publication Data
US 2008/0100266 A1    May 1, 2008

(30) Foreign Application Priority Data

Oct. 25, 2006    (JP)    .............................. 2006-289945
Jun. 25, 2007    (JP)    .............................. 2007-166110

(51) Int. Cl.
*H02J 7/00*    (2006.01)

(52) U.S. Cl. ....................... 320/134; 320/122; 320/136; 324/433

(58) Field of Classification Search .................. 320/134
See application file for complete search history.

(56) References Cited

U.S. PATENT DOCUMENTS

| 5,691,556 A | * | 11/1997 | Saito et al. ................... 257/350 |
| 7,034,580 B2 | | 4/2006 | Yano et al. |
| 7,446,575 B2 | | 11/2008 | Yano et al. |
| 7,564,217 B2 | | 7/2009 | Tanigawa et al. |

| 2002/0047685 A1 | * | 4/2002 | Perelle ........................ 320/119 |
| 2006/0082343 A1 | | 4/2006 | Sobue et al. |
| 2006/0158201 A1 | | 7/2006 | Sobue et al. |

FOREIGN PATENT DOCUMENTS

| JP | A-11-178226 | 7/1999 |
| JP | A-2003-070171 | 3/2003 |

OTHER PUBLICATIONS

Office Action mailed Apr. 27, 2010 issued from the Japan Patent Office in the corresponding patent application No. 2007-166110 (and English translation).

* cited by examiner

*Primary Examiner*—Edward Tso
*Assistant Examiner*—Arun Williams
(74) *Attorney, Agent, or Firm*—Posz Law Group, PLC

(57) ABSTRACT

A semiconductor integrated circuit device formed by a trench dielectric isolation technique has input terminals connected to positive and negative terminals of secondary cells of an assembled battery and includes monitor circuits for respectively monitoring cell voltages of the cells. Each monitor circuit includes a cell voltage detection circuit, a reference voltage generation circuit, and a comparison circuit. The cell voltage detection circuit divides a voltage between the input terminals connected to the positive and negative terminals of a corresponding cell and detects the cell voltage based on the divided voltage. The reference voltage generation circuit generates a reference voltage from the cell voltage. The comparison circuit is powered by the cell voltage of the corresponding cell and compares the divided voltage with the reference voltage.

5 Claims, 12 Drawing Sheets

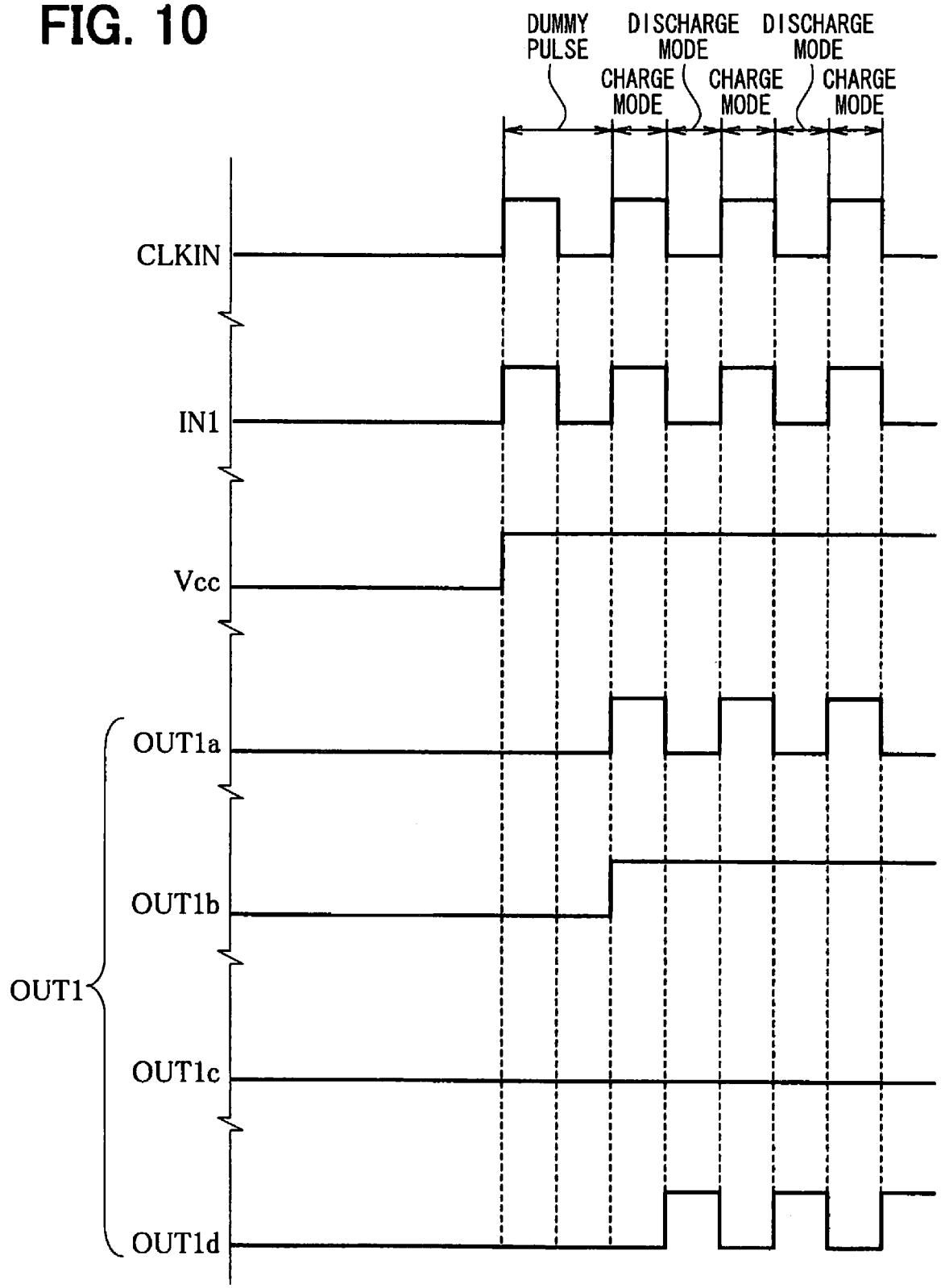

FIG. 11

| DETECTION MODE | CLKIN | CELL CONDITION | COMPARATOR OUTPUT | NOR1 | NAND1 |
|---|---|---|---|---|---|
| OVER-CHARGE | L | NORMAL | ALL L | L | L |
| | | PARTIALLY OVERCHARGE | NORMAL L OVERCHARGE H | L | H |
| | | ALL OVERCHARGE | ALL H | H | H |
| OVER-DISCHARGE | H | ALL OVERDISCHARGE | ALL L | L | L |
| | | PARTIALLY OVERDISCHARGE | NORMAL H OVERDISCHARGE L | L | H |
| | | NORMAL | ALL H | H | H |

FIG. 12

| DETECTION MODE | CLKIN | NOR1 | NAND1 | CELL CONDITION | OUT1A |
|---|---|---|---|---|---|
| OVER-CHARGE | L | L | L | NORMAL | H |
| | | L | H | PARTIALLY OVERCHARGE | L |
| | | H | H | ALL OVERCHARGE | L |
| OVER-DISCHARGE | H | L | L | ALL OVERDISCHARGE | H |
| | | L | H | PARTIALLY OVERDISCHARGE | H |
| | | H | H | NORMAL | L |

| DETECTION MODE | CLKIN | IN1 | IN1A | OUT1A | CELL UNIT CONDITION | | OUT1B | OUT1 |
|---|---|---|---|---|---|---|---|---|
| | | | | | UPSTREAM | CORRESPONDING | | |
| OVER-CHARGE | L | H | L | L | OVERCHARGE | OVERCHARGE | L | H |
| | | H | L | H | OVERCHARGE | NORMAL | L | H |
| | | L | H | L | NORMAL | OVERCHARGE | L | H |
| | | L | H | H | NORMAL | NORMAL | H | L |
| OVER-DISCHARGE | H | H | L | L | NORMAL | NORMAL | L | H |
| | | H | L | H | NORMAL | OVERDISCHARGE | H | L |
| | | L | H | L | OVERDISCHARGE | NORMAL | H | L |
| | | L | H | H | OVERDISCHARGE | OVERDISCHARGE | H | L |

SEMICONDUCTOR INTEGRATED CIRCUIT DEVICE FOR MONITORING CELL VOLTAGES

CROSS CHECK TO RELATED APPLICATION

This application is based on and incorporates herein by reference Japanese Patent Applications No. 2006-289945 filed on Oct. 25, 2006 and No. 2007-166110 filed on Jun. 25, 2007.

FIELD OF THE INVENTION

The present invention relates to a semiconductor integrated circuit device that monitors a cell voltage of an assembled battery.

BACKGROUND OF THE INVENTION

An assembled battery has been used as a battery for an electric vehicle (EV) and a hybrid electric vehicle (HEV). Such an assembled battery is constructed with a number of secondary cells connected in series to produce a high voltage of about between 100 and 400 volts. For example, an assemble battery of 300 volts is constructed with 150 lead cells (2 volts per cell) connected in series, 250 nickel hydride cells (1.2 volts per cell) connected in series, or 80 lithium ion cells (about 3.6 volts per cell) connected in series.

A secondary cell, in particular, a lithium ion cell is sensitive to overcharging and overdischarging. If the secondary cell is used outside its rated voltage range, capacity of the secondary cell significantly decreases, and the secondary cell becomes overheated. Therefore, a cell voltage of the secondary cell is monitored by a cell voltage monitor circuit. The cell voltage monitor circuit detects that the cell voltage exceeds the rated voltage range.

JP-A-2003-70171 discloses a measurement circuit that measures a cell voltage of each of lithium ion cells that construct an assembled battery. The measurement circuit includes differential amplifier circuits constructed with operational amplifiers. The differential amplifier circuits are provided to the lithium ion cells, respectively. Each differential amplifier circuit uses a virtual ground as a reference potential to measure the cell voltage. The virtual ground has a potential equal to a potential at the midpoint of the assemble battery.

An integrated circuit (IC) 1 shown in FIG. 15 includes a cell voltage monitor circuit 2 that monitors cell voltages VV1-VV4 of secondary cells BC1-BC4, which are connected in series to construct an assembled battery 3. The IC 1 is formed by using junction isolation techniques. The cell voltage monitor circuit 2 uses a potential at a negative terminal of the cell BC1 as a reference potential (i.e., ground potential GND) to measure the cell voltages VV1-VV4. The cell BC1 is arranged on the lowest potential side of the assembled battery 3. The cell voltage monitor circuit 2 monitors the cell voltages VV1-VV4 by comparing the cell voltages VV1-VV4 with a reference voltage Vr. The reference voltage Vr is generated by a reference voltage generation circuit 8.

The cell voltage monitor circuit 2 includes sub monitor circuits 2a-2d that monitor the cell voltages VV1-VV4 of the cells BC1-BC4, respectively. As an example, the sub monitor circuits 2b includes an operational amplifier 4, a differential amplifier circuit 6, and a comparator 7. The operational amplifier circuit 4 is configured as a voltage follower. The differential amplifier circuit 6 includes resistors R1-R4 and an operational amplifier 5. The differential amplifier circuit 6 outputs the cell voltage VV2, which is a difference between a voltage V2 at a positive terminal of the cell BC2 and a voltage V1 at a negative terminal of the cell BC2. The comparator 7 compares the cell voltage VV2 with the reference voltage Vr. Although each of the sub monitor circuits 2a, 2c and 2d are configured in a similar manner to the sub monitor circuit 2b, the sub monitor circuit 2a has no differential amplifier circuit 6. A monitor signal generation circuit 9 outputs a monitor signal Sd in accordance with output signals of the sub monitor circuits 2a-2d.

The cell voltage monitor circuit 2 receives the terminal voltages V1-V4 of the cells BC1-BC4 with respect to the ground potential GND and generates the cell voltages VV2-VV4 by using the differential amplifier circuit 6. Therefore, the cell voltage monitor circuit 2 needs the operational amplifier circuits 4, 5 in addition to the comparator 7. As a result, the IC 1 requires a large chip size and a large current consumption.

SUMMARY OF THE INVENTION

In view of the above-described problem, it is an object of the present invention to provide a semiconductor integrated circuit device that monitors a cell voltage of an assembled battery with a reduced chip size and a reduced current consumption.

A semiconductor integrated circuit device for monitoring an assembled battery includes a plurality of input terminals and a plurality of monitor circuits. The input terminals are connected to positive and negative terminals of a plurality of secondary cells, which are connected in series to construct the assembled battery. Each monitor circuit is provided to a corresponding one of the plurality of secondary cells to monitor a cell voltage of the corresponding secondary cell. Each monitor circuit includes a cell voltage detection circuit, a reference voltage generation circuit, and a comparison circuit. The cell voltage detection circuit divides a voltage between the input terminals connected to the positive and negative terminals of the corresponding secondary cell and detects the cell voltage based on the divided voltage. The reference voltage generation circuit generates a reference voltage from the cell voltage. The comparison circuit compares the divided voltage with the reference voltage and outputs a monitor signal in accordance with a result of the comparison. The comparison circuit is powered by a voltage between the input terminals connected to a first one of the positive terminals of the plurality of secondary cells and a first one of the negative terminals of the plurality of secondary cells. A voltage of the first one of the positive terminals is equal to or greater than a voltage of the positive terminal of the corresponding secondary cell. A voltage of the first one of the negative terminals is equal to or less than a voltage of the negative terminal of the corresponding secondary cell.

The monitor circuits are constructed with circuit elements formed to an semiconductor layer disposed on a supporting substrate electrically isolated from the semiconductor layer. The circuit elements are electrically isolated from each other. Therefore, each monitor circuit can operate with respect to a different potential.

BRIEF DESCRIPTION OF THE DRAWINGS

The above and other objectives, features and advantages of the present invention will become more apparent from the following detailed description made with check to the accompanying drawings. In the drawings:

FIG. 10 is a waveform diagram for the semiconductor integrated circuit device of FIG. 7;

FIG. 11 is a logic table for a NOR gate and a NAND gate in the semiconductor integrated circuit device of FIG. 7;

FIG. 12 is a logic table for the first synthetic circuit of FIG. 8;

DETAILED DESCRIPTION OF THE PREFERRED EMBODIMENTS

First Embodiment

Figure 1:
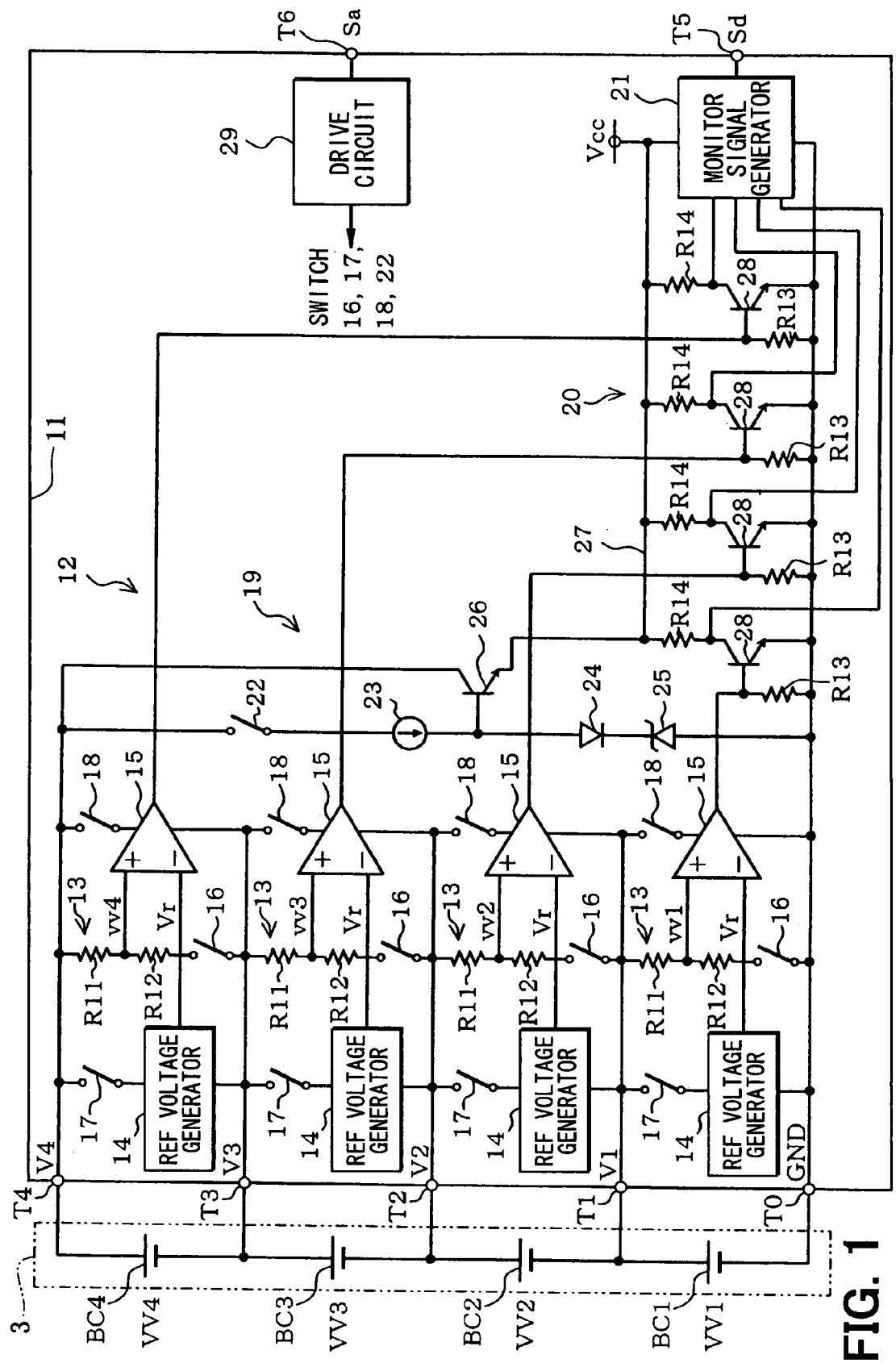
FIG. 1 is a circuit diagram of a semiconductor integrated circuit device according to a first embodiment of the present invention.

Referring to FIG. 1, an integrated circuit (IC) 11 according to a first embodiment of the present invention includes a cell voltage monitor circuit 12 that monitors cell voltages VV1-VV4 of secondary cells BC1-BC4 connected in series. The cells BC1-BC4 construct an assembled battery 3. For example, the assembled battery 3 is used as a battery for an electric vehicle (HEV) and a hybrid electric vehicle (HEV). The secondary cells BC1-BC4, may be for example, lithium ion cells. The IC 11 has input terminals T0-T4 and output terminals T5, T6. The cell BCi is connected between the input terminals T1-1, T1, where i is an integer from 1 to 4. For example, the cell BC2 is connected between the input terminals T1, T2.

When at least one of the cell voltages VV1-VV4 of the cells BC1-BC4 exceeds a predetermined reference voltage, a monitor signal Sd having a first level (e.g., high level) is outputted from the output terminal T5 of the IC 11. Further, when an interruption signal Sa (i.e., common on/off signal) having a second level (e.g., low level) is applied to the output terminal T6 of the IC 11, a dark current in the cell voltage monitor circuit 12 is interrupted. For example, the interrupt signal Sa becomes the low level, when a power supply switch (e.g., ignition switch, or main power switch) for turning on and off a power supply line connected to a vehicle motor (not shown) is off. The interrupt signal Sa becomes the high level, when the power supply switch is on.

The cell voltage monitor circuit 12 includes four sub monitor circuits, which are provided to the cells BC1-BC4 to monitor the cell voltages VV1-VV4, respectively. Each sub monitor circuit is configured in a similar manner and includes a cell voltage detection circuit 13, a reference voltage generation circuit 14, and a comparison circuit 15.

As an example, the sub monitor circuit provided to the cell BC1 is described below. The cell BC1 is arranged on the lowest potential side of the assembled battery 3. The cell voltage detection circuit 13 includes a voltage divider circuit constructed with resistors R13, R14 connected in series. The cell voltage detection circuit 13 and a switch 16 are connected in series between the input terminal T1 as a positive terminal of the cell BC1 and the input terminal T0 as a negative terminal of the cell BC1. The cell voltage detection circuit 13 outputs a detection voltage vv1 by dividing the cell voltage VV1 by a voltage division ratio of the voltage divider circuit.

The reference voltage generation circuit 14 generates a reference voltage Vr by using a bandgap reference circuit, for example. The reference voltage generation circuit 14 and a switch 17 are connected in series between the input terminals T1, T0.

The comparison circuit 15 may be, for example, a current output type comparator. The comparison circuit 15 is powered by a voltage between the input terminals T0, T1. The detection voltage vv1 outputted from the cell voltage detection circuit 13 is applied to a non-inverting input terminal of the comparison circuit 15. The reference voltage Vr outputted from the reference voltage generation circuit 14 is applied to an inverting input terminal of the comparison circuit 15.

The reference voltage Vr corresponds to an upper limit voltage of each of the cell voltages VV1-VV4. The upper limit voltage is set so that the cells BC1-BC4 are protected from overcharging. The reference voltage Vr has a value determined by multiplying the upper limit voltage by the voltage division ratio of the voltage detection circuit 13. A switch 18 is connected between a power line of the comparison circuit 15 and the input terminal T1.

A power supply circuit 19 generates a power supply voltage Vcc (e.g., 5 volts) supplied to a current-to-voltage (C/V) conversion circuit 20 and a monitor signal generation circuit 21. The power supply circuit 19 includes a transistor 26 and a series circuit of a constant current circuit 23, a diode 24, and a zener diode 25. A switch 22 and the series circuit are connected in series between the input terminals T4, T0. The transistor 26 has a base connected to an anode of the diode 24, a collector connected to the input terminal T4, and an emitter connected to a power line 27.

The C/V conversion circuit 20 converts output currents of each comparison circuit 15 of the sub monitor circuits into voltage signals and outputs the voltage signals to the monitor signal generation circuit 21. The C/V conversion circuit 20 operates with respect to the potential (i.e., ground potential GND) at the negative terminal of the cell BC1.

The C/V conversion circuit 20 includes four sub conversion circuits, which are provided to the cells BC1-BC4, respectively. Each conversion circuit is configured in a similar manner and includes resistors R13, R14 and a transistor 28. The resistor R13 is connected between the ground potential GND and an output terminal of the respective comparison circuit 15. The resistor R14 and the transistor 28 are connected in series between the power line 27 and the ground potential GND. The transistor 28 has a base connected to the output terminal of the respective comparison circuit 15 and a collector connected to an input terminal of the monitor signal generation circuit 21.

The monitor signal generation circuit 21 receives the four voltage signals from the C/V conversion circuit 20. The monitor signal generation circuit 21 performs a logical NAND operation on the four voltage signals and outputs a NAND signal as the monitor signal Sd. The switches 16-18, and 22 are analog switches and receive the interruption signal Sa through a drive circuit 29. When the interruption signal Sa is at the high level, the switches 16-18, and 22 are on. In contrast, when the interruption signal Sa is at the low level, the switches 16-18, and 22 are off.

Figure 2:
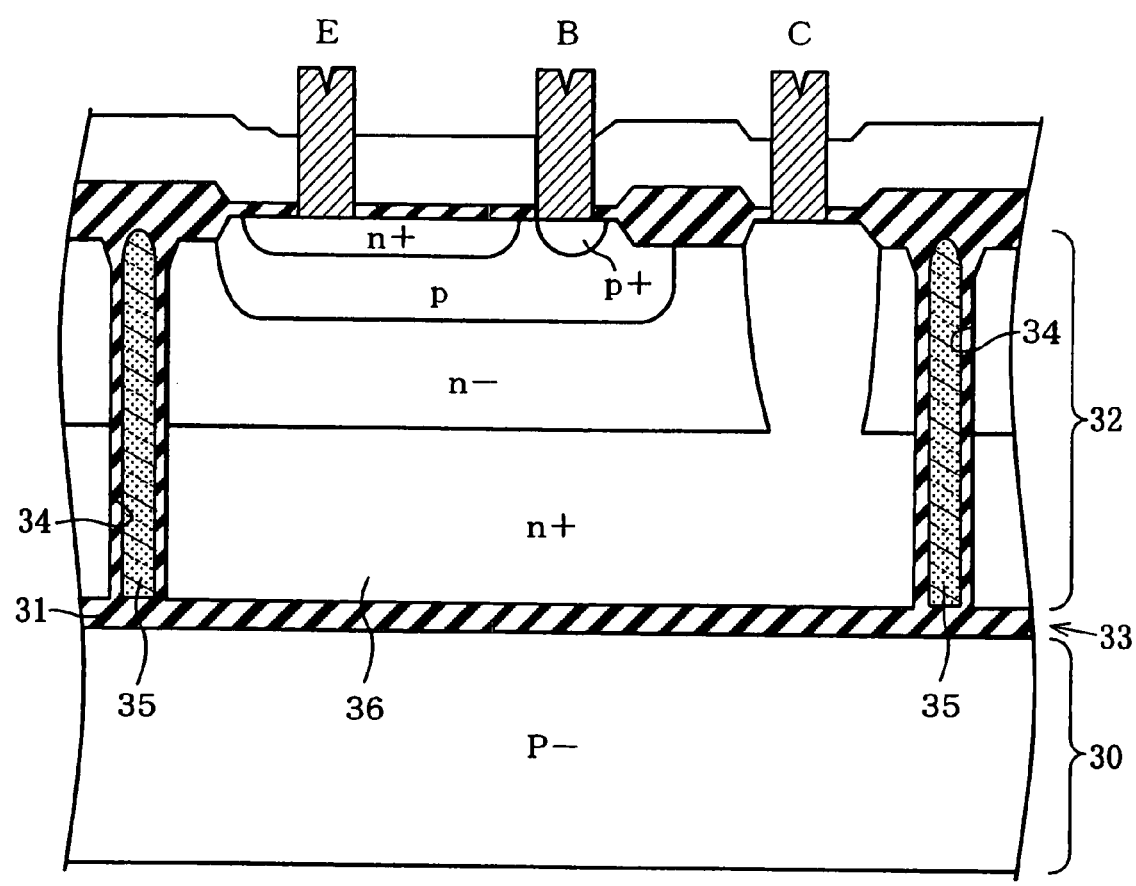
FIG. 2 is a schematic cross-sectional view of the device of FIG. 1.

As shown in FIG. 2, the IC 11 is formed by using a silicon on insulator (SOI) substrate 33. The SOI substrate 33 is formed by forming a single crystal silicon layer 32 (i.e., semiconductor layer) on a single crystal silicon substrate 30 (i.e., supporting substrate) through an isolation layer 31 made of a silicon oxide film. The single crystal silicon layer 32 has a trench 34 reaching the isolation layer 31. A silicon oxide film is formed in the trench 34, and then a polysilicon 35 is formed in the trench 34. Thus, element forming regions 36 electrically isolated from each other are formed. The elements constructing the IC 11 are formed in the element forming regions 36 and isolated from each other. As an example of the elements, a bipolar transistor is illustrated in FIG. 2. While the IC 11 except for the monitor signal generation circuit 21 is manufactured by a bipolar process, the monitor signal generation circuit 21 is manufactured by a complementary metal oxide semiconductor (CMOS) process.

As described above, the IC 11 is manufactured by a trench dielectric isolation technique, not a junction isolation technique. Because of the trench dielectric isolation, there is no parasitic diode between a substrate potential and each element so that each element can operate with respect to a different potential. Therefore, each of the sub monitor circuits provided to the cells BC1-BC4 can operate with respect to a different potential.

Specifically, the sub monitor circuit provided to the cell BCi operates with respect to the potential at the negative terminal of the cell BCi, where i is an integer from 1 to 4. The sub monitor circuit provided to the cell BCi can be provided between the input terminal Ti as the positive terminal of the cell BCi and the input terminal T1-1 as the negative terminal of the cell BCi, where i is an integer from 1 to 4. Thus, the comparison circuit 15 of the sub monitor circuit provided to the cell BCi can directly compare the detection voltage vvi with the reference voltage Vr, where i is an integer from 1 to 4.

The comparison circuit 15 has a transistor (not shown) on the output stage. When the detection voltage vvi is less than the reference voltage Vr, the output transistor is off so that the comparison circuit 15 provided to the cell BCi does not output an electric current. Accordingly, the transistor 28 of the sub conversion circuit provided to the cell BCi is turned off so that the voltage signal outputted from the sub conversion circuit provided to the cell BCi to the monitor signal generation circuit 21 becomes the high level (i.e., Vcc).

In contrast, when the detection voltage vvi is equal to or greater than the reference voltage Vr, the output transistor is on so that the comparison circuit 15 provided to the cell BCi outputs an electric current. Accordingly, the transistor 28 of the sub conversion circuit provided to the cell BCi is turned on so that the voltage signal outputted from the sub conversion circuit provided to the cell BCi to the monitor signal generation circuit 21 becomes the low level (i.e., GND). When at least one of the voltage signals outputted from the C/V conversion circuit 20 to the monitor signal generation circuit 21 is at the low level, the monitor signal generation circuit 21 detects overcharging and outputs the monitor signal Sd having the high level.

According to the first embodiment, the detection voltages vv1-vv4 of the cell voltages VV1-VV4 are directly compared with the reference voltage Vr by the respective comparator circuits 15. Therefore, unlike the cell voltage monitor circuit 2 of the conventional IC 1 shown in FIG. 1, the cell voltage monitor circuit 12 of the IC 11 has no differential amplifier circuit. As a result, as compared to the conventional IC1, the IC 11 has a reduced chip size and a reduced current consumption. Further, a differential amplifier circuit is constructed with an operational amplifier, which causes errors due to an offset voltage or the like. Since the cell voltage monitor circuit 12 has no differential amplifier circuit, the cell voltage monitor circuit 12 can accurately monitor the cell voltages VV1-VV4.

Operating currents of the sub monitor circuits are approximately equal to each other. Therefore, an electric current flowing from the input terminal T1 to the negative terminal of the cell BC2 cancels an electric current flowing from the positive terminal of the cell BC1 to the input terminal T1. Likewise, an electric current flowing from the input terminal T2 to the negative terminal of the cell BC3 cancels an electric current flowing from the positive terminal of the cell BC2 to the input terminal T2. Likewise, an electric current flowing from the input terminal T3 to the negative terminal of the cell BC4 cancels an electric current flowing from the positive terminal of the cell BC3 to the input terminal T3. As a result, operating currents corresponding to the power supply circuit 19 and one sub monitor circuit (i.e., one cell voltage detection circuit 13, one reference voltage generation circuit 14, and one comparison circuit 15) flow through the assembled battery 3. Therefore, a current consumption in the IC11 can be smaller than that in the conventional IC1. Further, variations in the currents in the cells BC1-BC4 can be reduced.

Further, according to the first embodiment, the switches 16-18, and 22 are connected in series with the cell voltage detection circuit 13, the reference voltage generation circuit 14, the comparison circuit 15, and the power supply circuit 19, respectively. When the power supply switch such as an ignition switch is tuned off, the switches 16-18, and 22 are tuned off. In such an approach, when the vehicle is not used, a dark current in the cell voltage monitor circuit 12 can be reduced.

Second Embodiment

Figure 3:
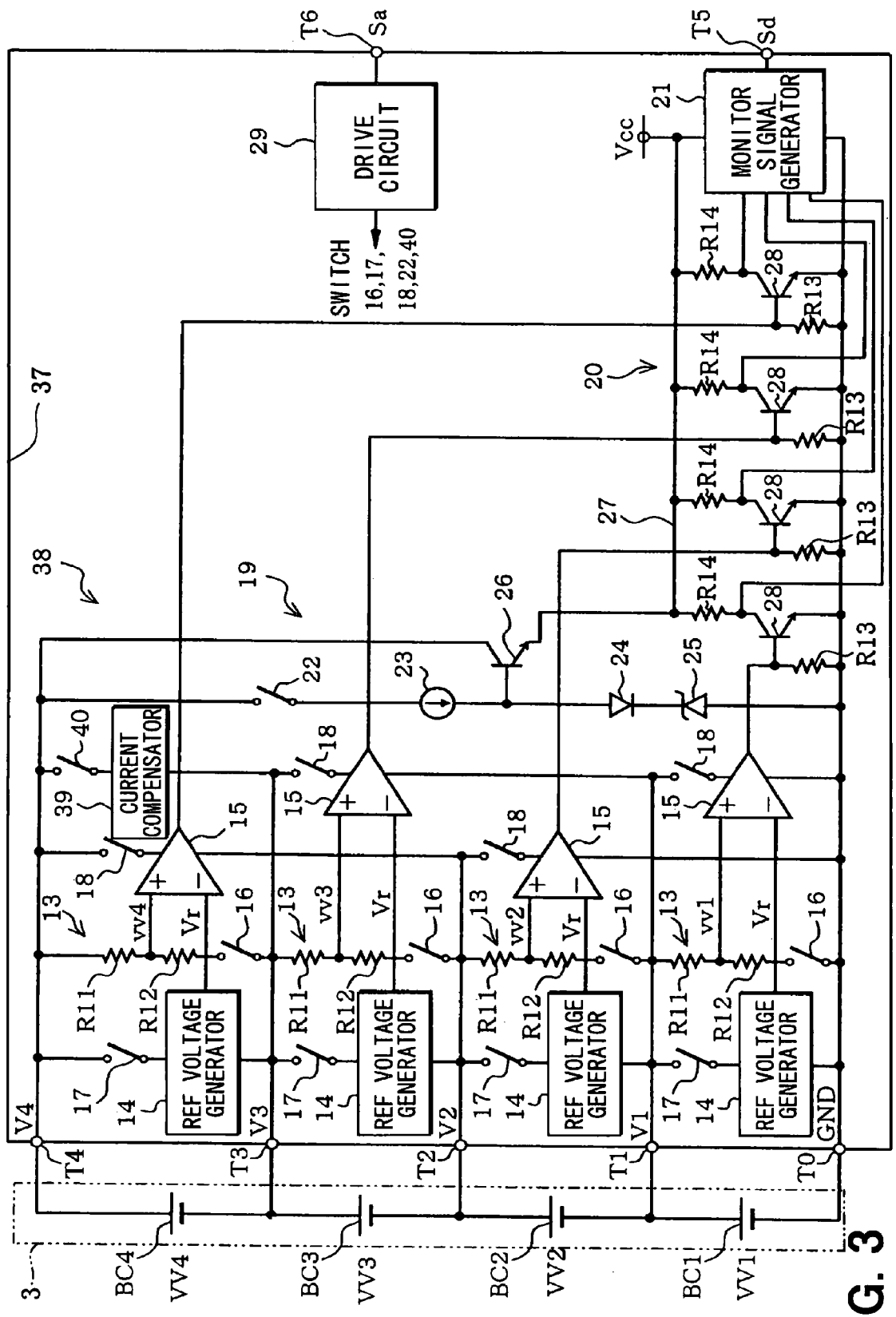
FIG. 3 is a circuit diagram of a semiconductor integrated circuit device according to a second embodiment of the present invention.

An IC 37 according to a second embodiment of the present invention is described with reference to FIG. 3. Differences between the IC 37 shown in FIG. 3 and the IC 11 shown in FIG. 1 are as follows:

A comparator 15 provided to a cell BC1 is powered by a voltage supplied via a switch 18 from between positive and negative terminals of the cell BC1. The cell BC1 is arranged on the lowest potential side of the assembled battery 3. The comparator 15 provided to the cell BCi is powered by a voltage supplied via a switch 18 from between a positive terminal of a cell BCi and a negative terminal of a cell BCi-1, where i is an integer from 2 to 4. For example, the comparator 15 provided to the cell BC3 is powered by a voltage supplied via a switch 18 from between a positive terminal of the cell BC3 and a negative terminal of the cell BC2.

In such an approach, even when the cell voltages VV1-VV4 decrease significantly, the comparison circuit 15 provided to each of the cells CB2-CB4 can be supplied with enough power voltage. However, this approach causes an electric current to flow from an negative terminal of the cell BC4 to the input terminal T3. The cell BC4 is arranged on the highest potential side of the assembled battery 3.

To cancel the electric current flowing from the negative terminal of the cell BC4, a current compensation circuit 39 is provided between input terminals T3, T4 of the IC 37 through a switch 40. The current compensation circuit 39 produces an electric current approximately equal to an operating current of the comparison circuit 15 so that the electric current flowing from the negative terminal of the cell BC4 can be cancelled. An interruption signal Sa is applied to the switch 40 through a drive circuit 29. When the interruption signal Sa is at the high level, the switch 40 is turned on.

As a result, operating currents corresponding to the power supply circuit 19, one sub monitor circuit, and one additional comparison circuit 15 (i.e., one cell voltage detection circuit 13, one reference voltage generation circuit 14, and two comparison circuits 15) flow through the assembled battery 3. Therefore, a current consumption in the IC37 can be smaller than that in the conventional IC1. Further, variations in the currents in the cells BC1-BC4 can be reduced.

Third Embodiment

Figure 4:
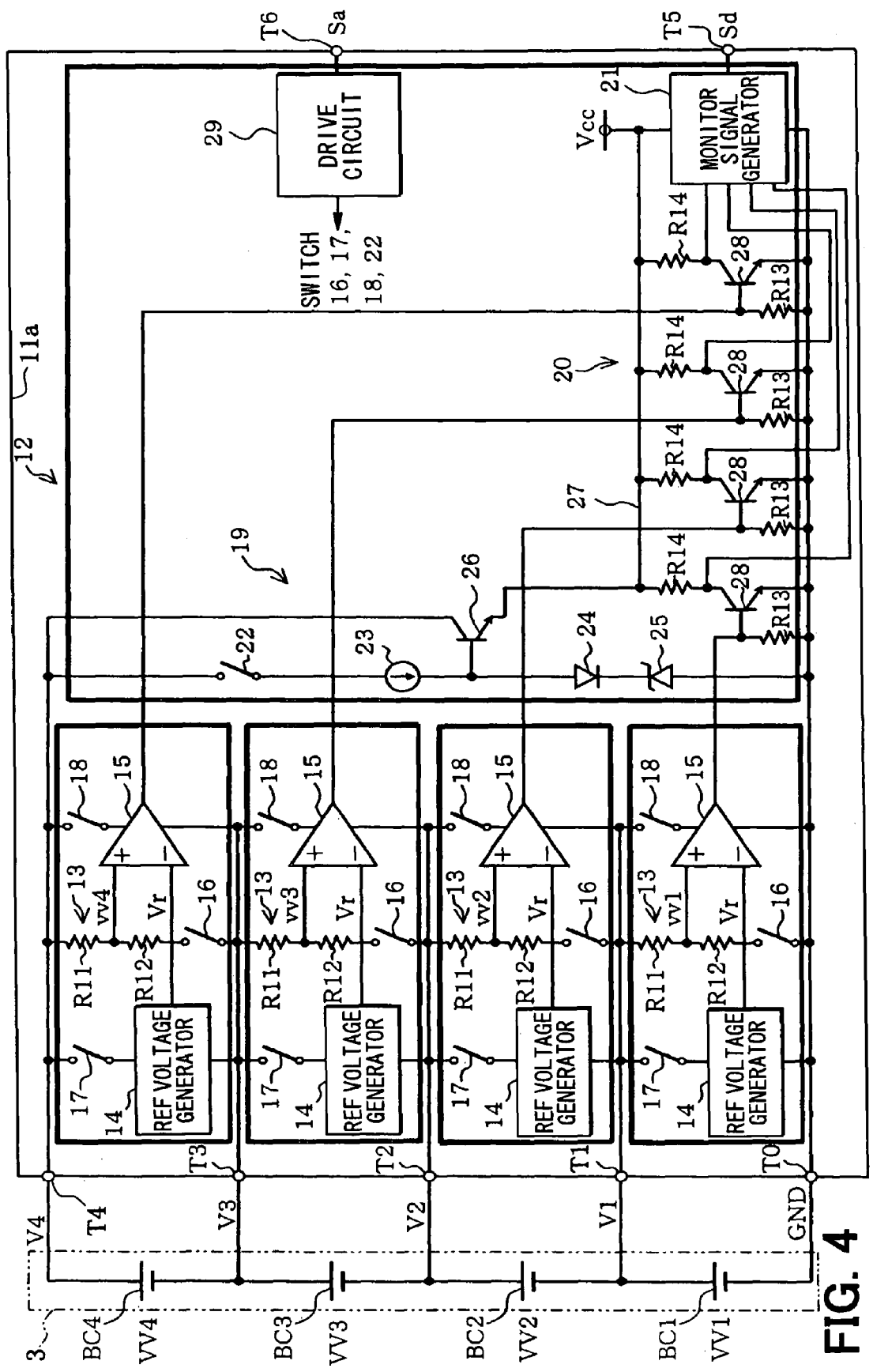
FIG. 4 is a circuit diagram of a semiconductor integrated circuit device according to a third embodiment of the present invention.

An IC 11a according to a third embodiment of the present invention is described with reference to FIG. 4. Differences between the IC 11a shown in FIG. 4 and the IC 11 shown in FIG. 1 are as follows:

In the first embodiment, as shown in FIG. 2, each element is electrically isolated by the trench 34 formed on the single crystal silicon layer 32 of the SOI substrate 33.

Like in the first embodiment, in the third embodiment, each element is electrically isolated by the trench 34 formed on the single crystal silicon layer 32 of the SOI substrate 33. Further, each circuit forming region, where elements operating with respect to the same potential are formed, is electrically isolated by an additional trench. Specifically, as shown in FIG. 4, circuit forming regions, where the sub monitor circuits are formed, respectively, are isolated from each other by the additional trench. Further, a circuit forming region, where the power supply circuit 19, the C/V conversion circuit 20, the monitor signal generation circuit, and the drive circuit 29 are formed, is isolated by the additional trench.

According to the third embodiment, each circuit forming region, where elements operating with respect to the same potential are formed, is doubly electrically isolated by the trenches. Therefore, noise (e.g., due to a potential variation) entering the cell voltage monitor circuit 12 through power lines connected to the input terminals T0-T4 can be reduced. Further, noise transmitted between the sub monitor circuits can be reduced. Furthermore, noise entering the C/V conversion circuit 20 and the monitor signal generation circuit 21 can be reduced.

Fourth Embodiment

Figure 5:
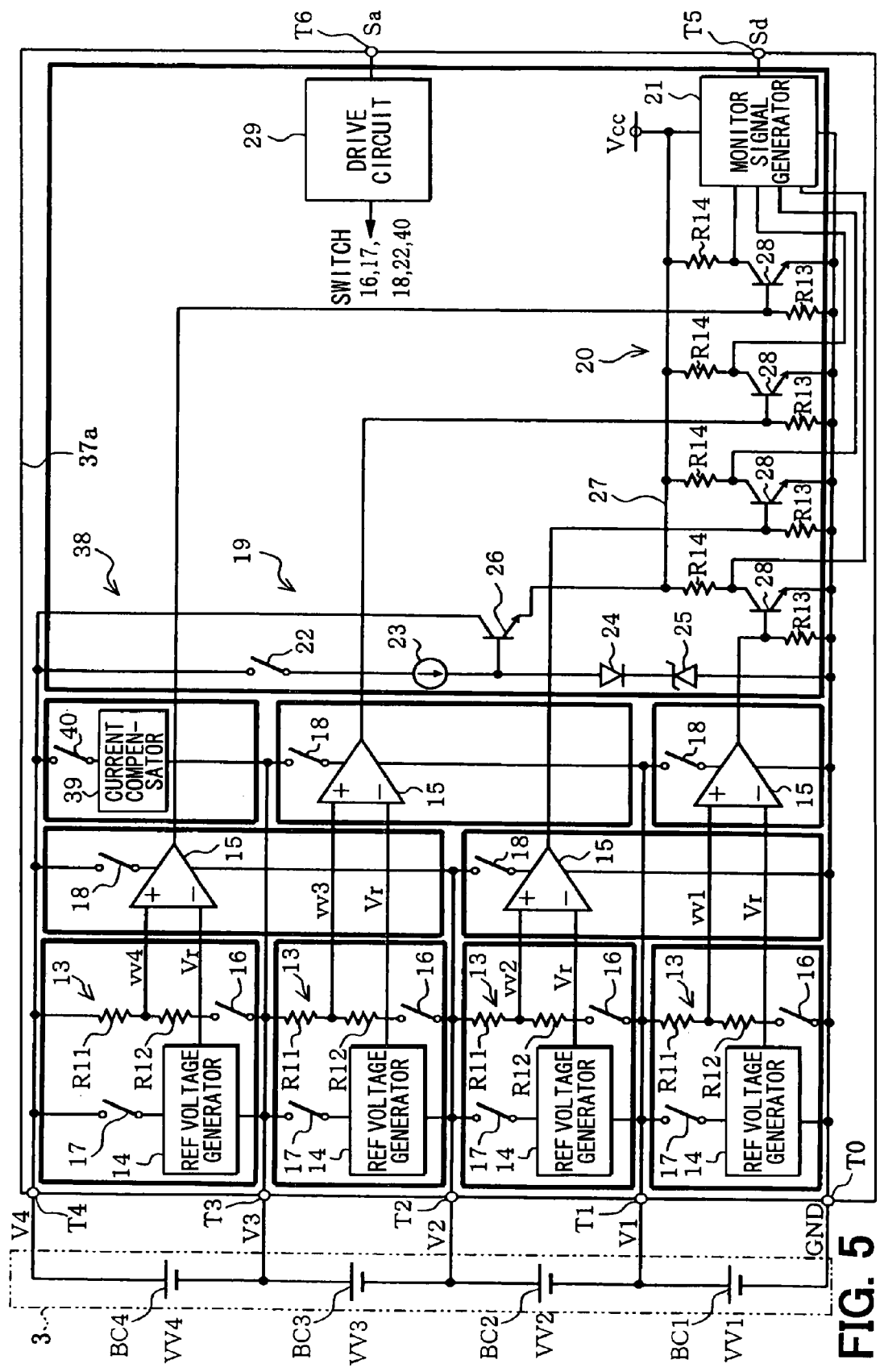
FIG. 5 is a circuit diagram of a semiconductor integrated circuit device according to a fourth embodiment of the present invention.

An IC 37a according to a fourth embodiment of the present invention is described with reference to FIG. 5. Differences between the IC 37a shown in FIG. 5 and the IC 37 shown in FIG. 3 are as follows:

In the second embodiment, each element is electrically isolated by the trench 34 formed on the single silicon layer 32 of the SOI substrate 33. Like in the second embodiment, in the fourth embodiment, each element is electrically isolated by the trench 34 formed on the single crystal silicon layer 32 of the SOI substrate 33. Further, each circuit forming region, where elements operating with respect to the same potential are formed, is electrically isolated by an additional trench. Specifically, as shown in FIG. 5, circuit forming regions, where the sub monitor circuits except for the comparison circuits 15 are formed, respectively, are isolated from each other by the additional trench.

Further, circuit forming regions, where the comparison circuits 15 are formed, respectively, are isolated from each other by the additional trench. Furthermore, a circuit forming region, where the current compensation circuit 39 is formed, is isolated by the additional trench. Furthermore, a circuit forming region, where the power supply circuit 19, the C/V conversion circuit 20, the monitor signal generation circuit, and the drive circuit 29 are formed, is isolated by the additional trench. Alternatively, the cell voltage detection circuit 13 and the reference voltage generation circuit 14 provided to the cell BC1, which is arranged on the lowest potential side of the assembled battery 3, may not be electrically isolated from the comparison circuit 15 provided to the cell BC1.

According to the fourth embodiment, each circuit forming region, where elements operating with respect to the same potential are formed, is doubly electrically isolated by the trenches. Therefore, noise (e.g., due to a potential variation) entering the cell voltage monitor circuit 12 through power lines connected to the input terminals T0-T4 can be reduced. Further, noise transmitted between the sub monitor circuits can be reduced. Furthermore, noise entering the C/V conversion circuit 20 and the monitor signal generation circuit 21 can be reduced.

Fifth Embodiment

A cell voltage monitor apparatus according to a fifth embodiment of the present invention is described with reference to FIGS. 6-13. The cell voltage monitor apparatus includes a plurality of ICs 41 and monitors overcharging and overdischarging of each cell of an assembled battery 3. The assembled battery 3 is constructed with m secondary cells BC1-BCm, where m is an integral multiple of 4. Adjacent four cells (e.g., BC1-BC4) form one cell group. Each IC 41 monitors one cell group.

Figure 6:
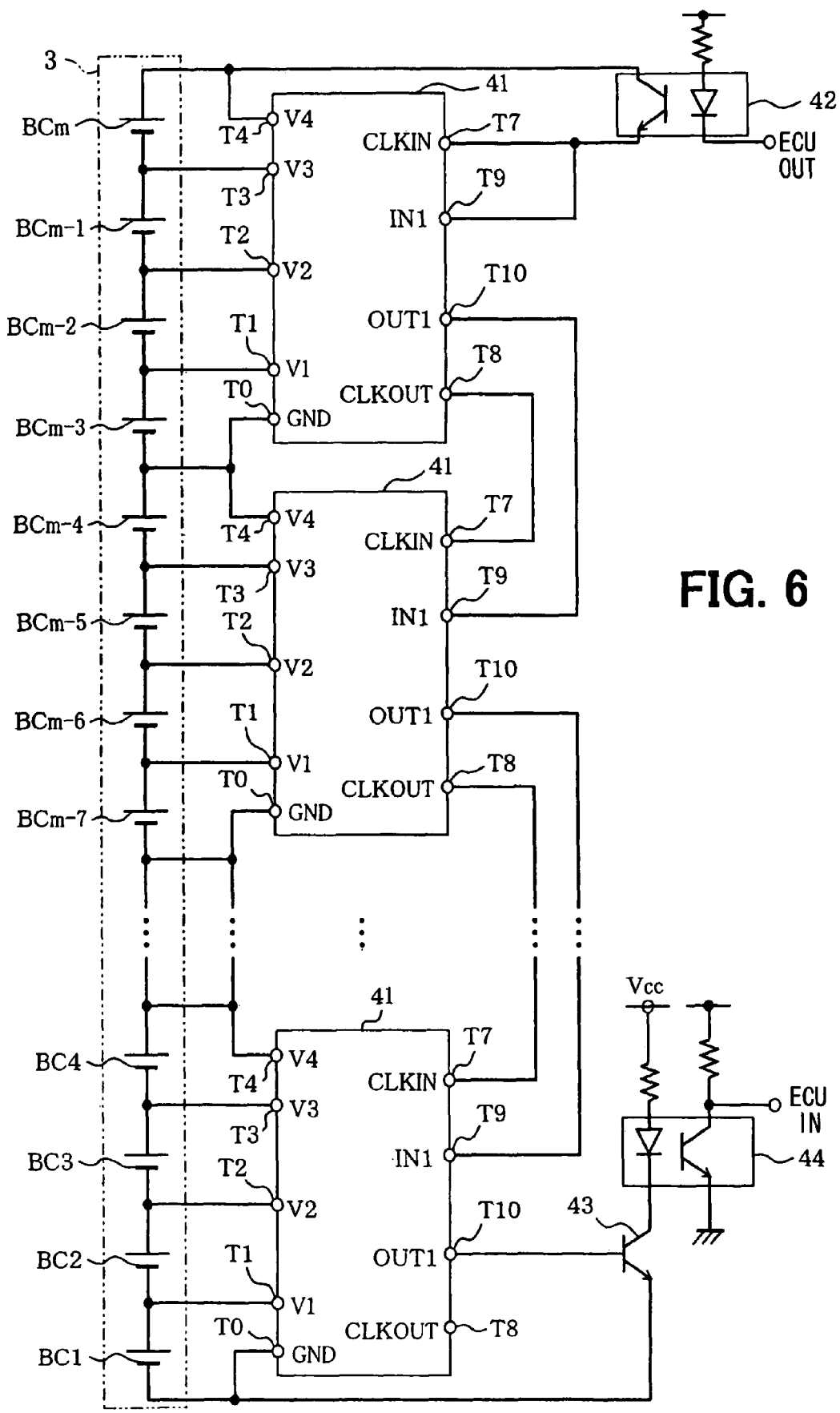
FIG. 6 is a circuit diagram of a cell voltage monitor apparatus according to a fifth embodiment of the present invention.

As shown in FIG. 6, each IC 41 has input terminals T0-T4 connected to one cell group of the assembled battery 3. In addition to the input terminals T0-T4, each IC 41 has input terminal T7, T9 and output terminals T8, T10. The IC 41 receives a clock signal CLKIN via the input terminal T7 and outputs a clock signal CLKOUT via the output terminal T8. The IC 41 receives a monitor signal IN1 via the input terminal T9 and outputs a monitor signal OUT1 via the output terminal T10.

The IC 41 provided to a cell group arranged on the highest potential side of the assembled battery 3 receives a clock pulse via the input terminals T7, T9. The clock pulse is fed from an electronic control unit (ECU) through a photocoupler (i.e., opto-isolator) 42.

The IC 41 provided to a cell group arranged on the lowest potential side of the assembled battery 3 outputs a total monitor signal via the output terminal T10. The total monitor signal is inputted to the ECU through a transistor 43 and a photocoupler 44.

The Input terminals T7, T9 of the IC 41 provided to other cell group are connected to the output terminals T8, T10 of the IC 41, respectively, provided to the adjacent cell group arranged on the higher potential side of the assembled battery 3. The output terminals T8, T10 of the IC 41 provided to other cell group are connected to the input terminals T7, T9 of the IC 41, respectively, provided to the adjacent cell group arranged on the lower potential side of the assembled battery 3.

Figure 7:
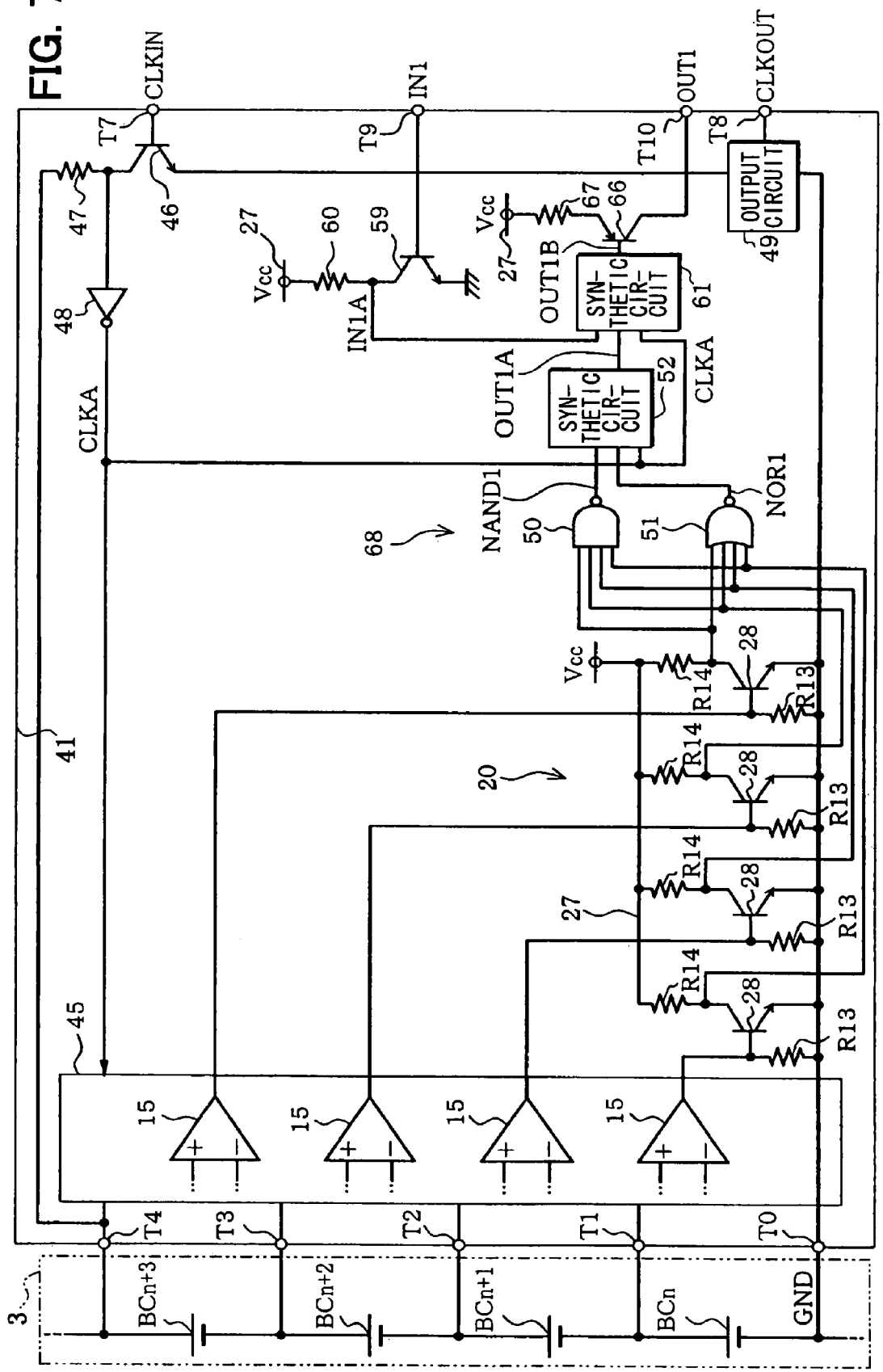
FIG. 7 is a circuit diagram of a semiconductor integrated circuit device in the cell voltage monitor apparatus of FIG. 6.

As shown in FIG. 7, the IC 41 includes a cell voltage monitor circuit 45. The cell voltage monitor circuit 45 is configured in a similar manner to the cell voltage monitor circuit 12 of the IC 11, except that the voltage division ratio of the cell voltage detection circuit 13 varies with a clock signal CLKA.

The clock signal CLKIN applied to the input terminal T7 is used to start the IC 41 and switch the IC 41 between an overcharging detection mode and an overdischarging detection mode. The input terminal T7 is connected to a base of a transistor 46. A collector of the transistor 46 is pulled up to the input terminal T4 through a resistor 47. An electrical signal outputted from the collector of the transistor 46 passes through an inverter 48 (i.e., NOT gate) and becomes the clock signal CLKA. The clock signal CLKA has a logic level equal to that of the clock signal CLKIN and is used to change the voltage division ratio of the cell voltage detection circuit 13. An output circuit 49 is connected between an emitter of the transistor 46 and the ground potential GND. The output circuit 49 controls a power supply condition in the IC 41 and outputs the clock signal CLKOUT that has the same waveform as that of the clock signal CLKIN.

Four condition signals outputted from the C/V conversion circuit 20 are inputted to a NAND gate 50. The NAND gate 50 performs an NAND operation on the four condition signals and outputs an NAND signal NAND1 to a first synthetic circuit 52. Likewise, the four condition signals outputted from the C/V conversion circuit 20 are inputted to a NOR gate 51. The NOR gate 51 performs an NOR operation on the four condition signals and outputs an NOR signal NOR1 to the first synthetic circuit 52. The condition signals indicate charging and discharging conditions of the assembled battery 3. Further, the clock signal CLKA is inputted to the first synthetic circuit 52.

Figure 8:
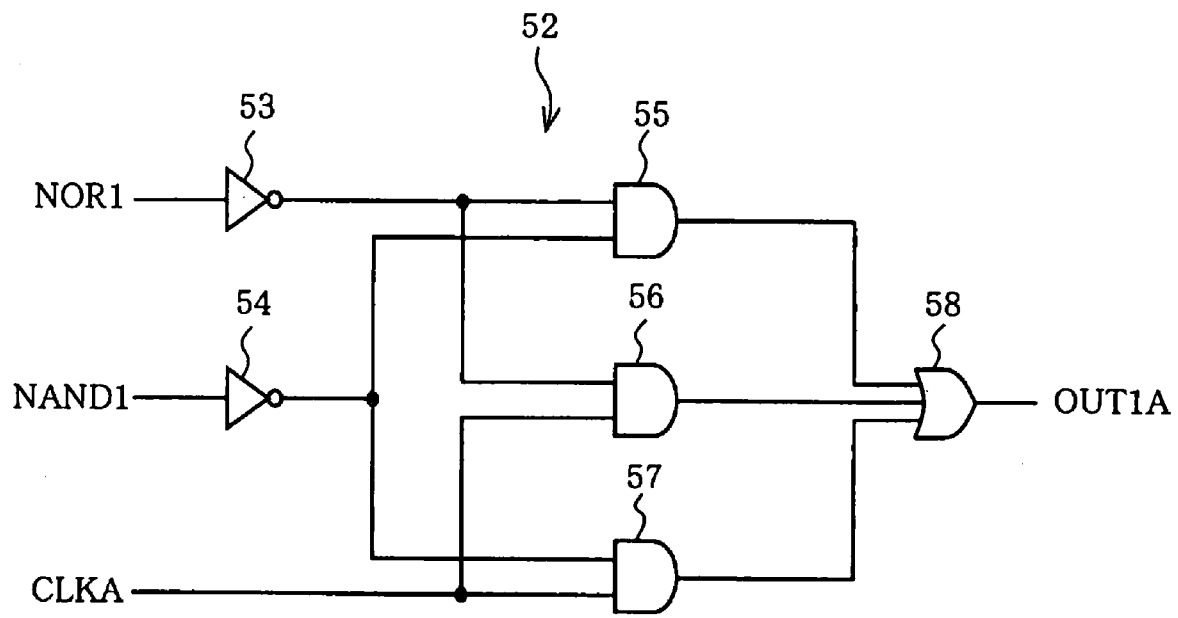
FIG. 8 is a circuit diagram of a first synthetic circuit in the semiconductor integrated circuit device of FIG. 7.

As shown in FIG. 8, the first synthetic circuit 52 includes inverters 53, 54, AND gates 55, 56, 57, and an OR gate 58. The first synthetic circuit 52 logically synthesizes the signals NOR1, NAND1, and CLKA and outputs a monitor signal OUT1A.

As shown in FIG. 7, the input terminal T9 for receiving the monitor signal IN1 is connected to a base of a transistor 59. An emitter of the transistor 59 is grounded, and a collector of the transistor 59 is pulled up to the power line 27 through a resistor 60. A monitor signal IN1A, which is inverse of the monitor signal IN1, is outputted from the collector of the transistor 59. The monitor signal IN1A, the monitor signal OUT1 A, the clock signal CLKA are inputted to a second synthetic circuit 61.

Figure 9:
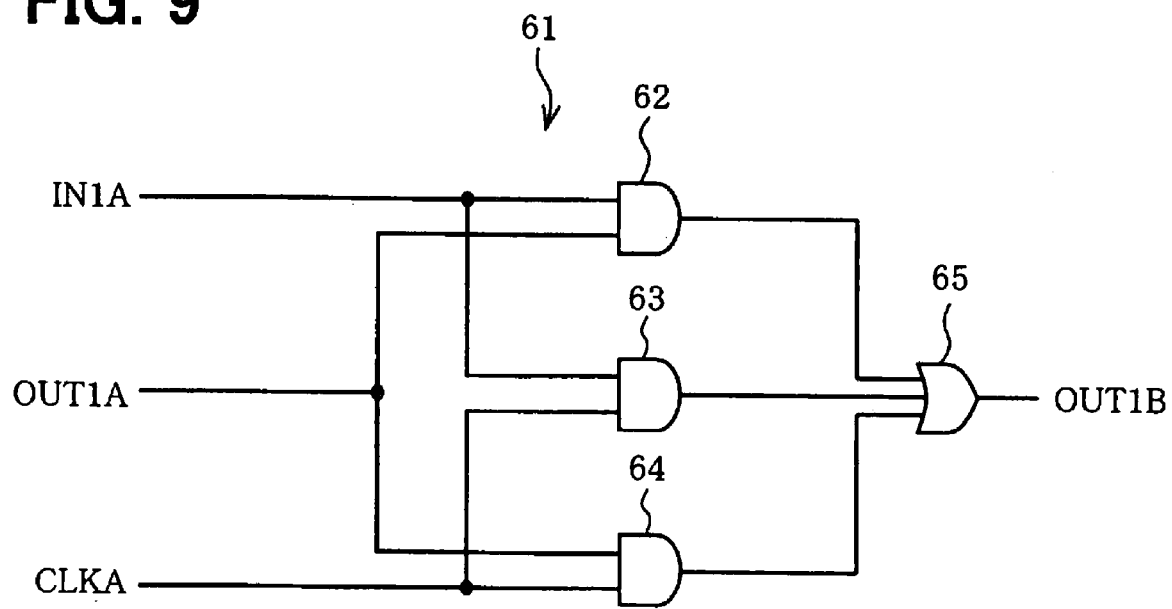
FIG. 9 is a circuit diagram of a second synthetic circuit in the semiconductor integrated circuit device of FIG. 7.

As shown in FIG. 9, the second synthetic circuit 61 includes AND gates 62-64 and an OR gate 65. The first synthetic circuit 52 logically synthesizes the signals IN1A, OUT1A, and CLKA and outputs a monitor signal OUT1B to a base of a transistor 66. The transistor 66 is connected via the resistor 67 between the power line 27 and the output terminal T10 in an open-collector manner. The monitor signal OUT1 outputted from the output terminal T10 is inverse of the monitor signal OUT1B. A monitor signal generation circuit 68 is constructed with the circuits provided between the NAND gate 50, the NOR gate 51 and the terminals T9, T10.

FIG. 10 shows waveforms of the clock signal CLKIN, the monitor signal IN1, the supply voltage Vcc, and the monitor signal OUT1. The monitor signal OUT1 shows a waveform indicated by a graph OUT1a, when all the cells BCn-BCn+3 are in normal conditions. The monitor signal OUT1 shows a waveform indicated by a graph OUT1b, when at least one of the cells BCn-BCn+3 overcharges. The monitor signal OUT1 shows a waveform indicated by a graph OUT1c, when at least one of the cells BCn-BCn+3 overdischarges. The monitor signal OUT1 shows a waveform indicated by a graph OUT1d, when at least one of the cells BCn-BCn+3 overcharges and overdischarges.

The first pulse of the clock signal CLKIN is a dummy pulse. When the IC 41 receives the clock signal CLKIN in a low power consumption state, the switches 16-18, and 22 are turned on synchronously with the dummy pulse of the clock signal CLKIN. The switches 16-18, and 22 are shown in FIG. 1 and omitted in FIG. 7. Then, the supply voltage Vcc is generated so that the circuits in the IC 41 start operation. The clock signal CLKIN outputted from the ECU is successively transmitted through the output circuit 49 from the IC 41 arranged on the higher potential side to the IC 41 arranged on the lower potential side. Each IC 41 starts a cell voltage monitoring operation synchronously with the clock signal CLKIN. When the clock signal CLKIN is lost for a certain period, the switches 16-18, and 22 are turned off so that the supply voltage Vcc is interrupted.

The signals NOR1, NAND1 outputted from the NOR gate 51 and the NAND gate 50 are generated according to a logic table shown in FIG. 11. The monitor signal OUT1A outputted from the first synthetic circuit 52 is generated according to a logic table shown in FIG. 12. The monitor signal OUT1B outputted from the second synthetic circuit 61 is generated according to a logic table shown in FIG. 13. Except the dummy pulse, when the clock signal CLKIN is at the low level (i.e., the first level), the IC 41 operates in an overcharging detection mode. In contrast, when the clock signal CLKIN is at the high level (i.e., the second level), the IC 41 operates in an overdischarging detection mode.

In the IC 41 provided to the cells BCn-BCn+3, the monitor signal generation circuit 68 generates the monitor signal OUT1A corresponding to the cells BCn-BCn+3 by using the first synthetic circuit 52. The monitor signal generation circuit 68 receives the monitor signal IN1, which is the monitor signal OUT1A outputted from the IC 41 provided to an adjacent cell group (i.e., cells BCn+4-BCn+7) arranged on the higher potential (i.e., upstream) side of the assembled battery 3. The monitor signal generation circuit 68 logically synthesizes the signals IN1, OUT1A by using the second synthetic circuit 61 and outputs the monitor signal OUT1 to the IC 41 provided to an adjacent cell group (i.e., cells BCn−4-BCn−1) arranged on the lower potential side of the assembled battery 3.

In the overcharging detection mode, the voltage division ratio of the cell voltage detection circuit 13 is set to a first division ratio. As shown in FIG. 11, all the cells BCn-BCn+3 are in a normal condition, i.e., all the cell voltages of the cells BCn-BCn+3 are below an upper limit voltage, all voltage signals outputted from the comparison circuits 15 become the low level. Accordingly, all the condition signals outputted from the C/V conversion circuit 20 become the high level. Therefore, only when all the cells BCn-BCn+3 are in the normal condition, the signal NAND1 becomes the low level.

Figures 13, 14:
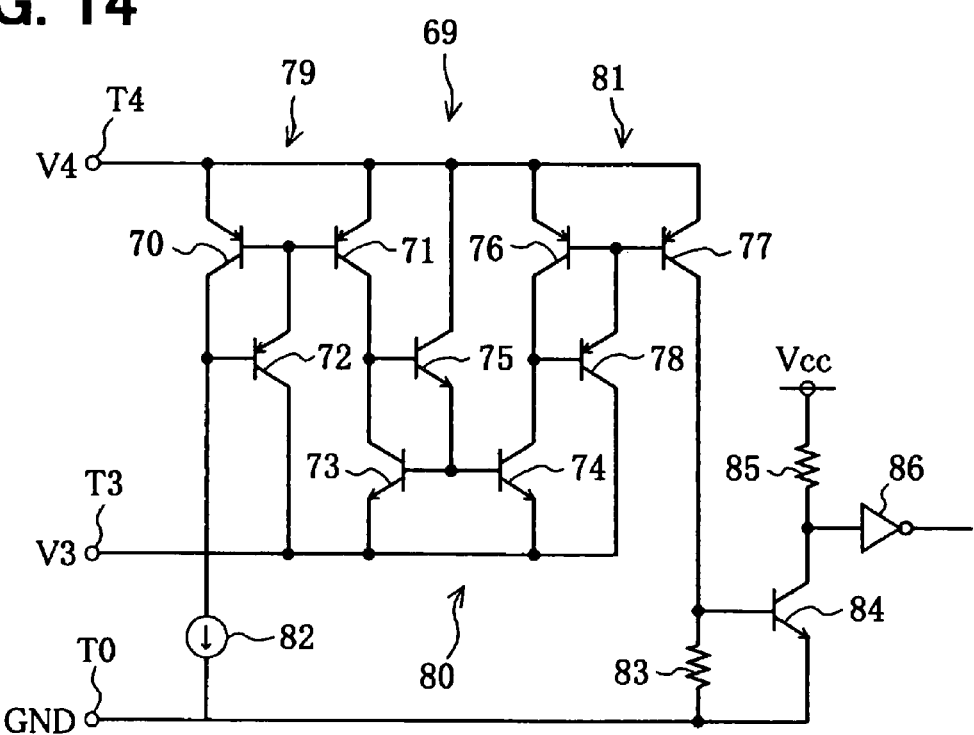
FIG. 13 is a logic table for the second synthetic circuit of FIG. 9.
FIG. 14 is a circuit diagram of an overdischarging detection circuit in a semiconductor integrated circuit device according to a six embodiment of the present invention.
Figure 15:
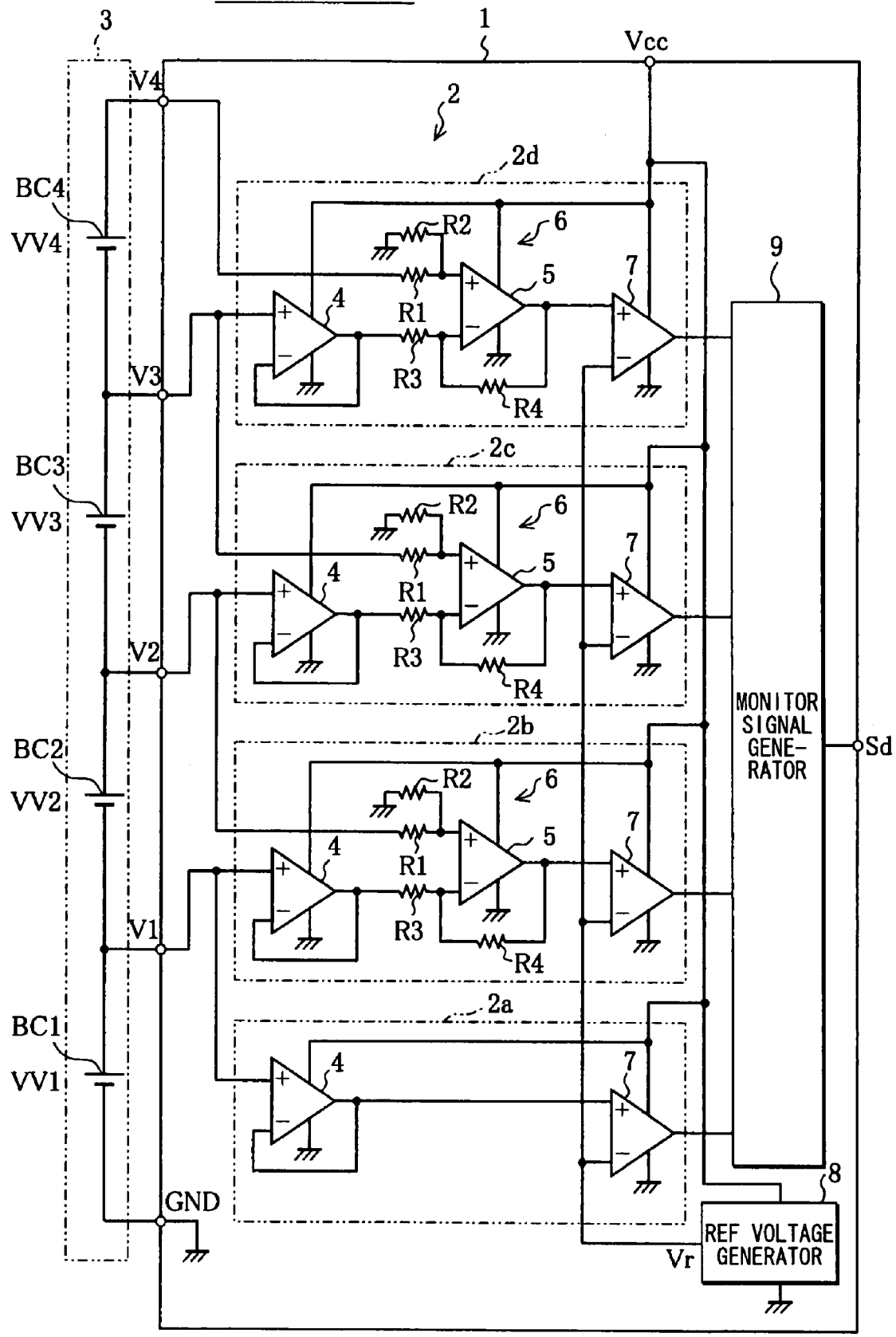
FIG. 15 is a circuit diagram of a semiconductor integrated circuit device according to a related art.

As shown in FIG. 12, only when the clock signal CLKA (i.e., CLKIN) is at the low level, and all the cells BCn-BCn+3 are in the normal condition, the monitor signal OUT1A becomes the high level. As shown in FIG. 13, only when all the cells BCn+4-BCn+7 arranged on the higher potential side are in the normal condition (i.e., the monitor signal IN1 is at the low level), and all the cells BCn-BCn+3 are in the normal condition (i.e., the monitor signal OUT1A is at the high level), the monitor signal OUT1 outputted from the output terminal T10 becomes the low level (i.e., the first level). When the monitor signal OUT1 is at the low level in the overcharging detection mode, it is determined that an overcharging condition does not occur.

In contrast, in the overdischarging detection mode, the voltage division ratio of the cell voltage detection circuit 13 is set to a second division ratio less than the first division ratio. As shown in FIG. 11, all the cells BCn-BCn+3 are in a normal condition, i.e., all the cell voltages of the cells BCn-BCn+3 are above a lower limit voltage, all the voltage signals outputted from the comparison circuits 15 become the high level. Accordingly, all the condition signals outputted from the C/V conversion circuit 20 become the low level. Therefore, only when all the cells BCn-BCn+3 are in the normal condition, the signal NOR1 becomes the high level.

As shown in FIG. 12, only when the clock signal CLKA (i.e., CLKIN) is at the high level, and all the cells BCn-BCn+3 are in the normal condition, the monitor signal OUT1A becomes the low level. As shown in FIG. 13, only when all the cells BCn+4-BCn+7 arranged on the higher potential side are in the normal condition (i.e., the monitor signal IN1 is at the high level), and all the cells BCn-BCn+3 are in the normal condition (i.e., the monitor signal OUT1A is at the low level), the monitor signal OUT1 outputted from the output terminal T10 becomes the high level (i.e., the second level). When the monitor signal OUT1 is at the high level in the overdischarging detection mode, it is determined that an overdischarging condition does not occur.

According to the fifth embodiment, the cell voltage monitor apparatus constructed with the ICs 41 outputs the total monitor signal OUT1 in response to the clock signal CLKIN received from the ECU. The total monitor signal reflects voltage conditions in all the cells of the assembled battery 3. Therefore, the overcharging and overdischarging in at least one cell of the assembled battery 3 can be detected based on the signal level of the monitor signal OUT1. Since the ECU can get the voltage conditions of all the cells of the assembled battery 3 by using one clock signal CLKIN, the ECU has no need to control each IC 41. Therefore, a load placed on the ECU to perform voltage monitoring is reduced. Further, the ECU can control the supply of the voltage Vcc to the ICs 41 by using one clock signal CLKIN. Therefore, the load placed on the ECU to perform the voltage monitoring is much reduced.

Sixth Embodiment

A sixth embodiment of the present invention is described with reference to FIG. 14. In the fifth embodiment described above, the overdischarging is detected in the same manner as the overcharging by using the cell voltage detection circuit 13, the reference voltage generation circuit 14, and the comparison circuit 15 shown in FIG. 1. In contrast, in the sixth embodiment, the overdischarging is detected by using an overdischarging detection circuit 69 having a simplified structure.

As shown in FIG. 14, the overdischarging detection circuit 69 includes three current mirror circuits 79-81, a constant current source 82, resistors 83, 85, a transistor 84, an inverter circuit (i.e., NOT gate) 86. The current mirror circuits 79-81 are connected between the input terminals T4, T3 in a multi-stage manner so that an electric current is successively transmitted from the current mirror circuit 79 to the current mirror circuit 81 via the current mirror circuit 80. The current mirror circuit 79 is constructed with transistors 70-72. The current mirror circuit 80 is constructed with transistors 73-75. The current mirror circuit 81 is constructed with transistors 76-78.

The constant current source 82 is connected between the first stage transistor 70 and an input terminal T0 (i.e., ground potential GND). The resistor 83 is connected between the final stage transistor 77 and the ground potential GND. A voltage drop across the resistor 83 is inverted by the transistor 84 and the resistor 85. The inverted voltage drop is inverted again by the inverter circuit 86 and then outputted from the overdischarging detection circuit 69. Likewise, the overdischarging detection circuit 69 is provided between the input terminals T3, T2, between the input terminals T2, T1, and between the input terminals T1, T0.

An output current of the constant current source 82 successively flows through the current mirror circuits 79, 80, 81, when the cell voltage VV4 appearing between the input terminals T4, T3 is equal to or greater than 2 Vf, where Vf is a p-n junction forward-bias voltage of about 0.7 volts. As a result, the transistor 84 is turned on so that the overdischarging detection circuit 69 outputs a high level signal. In contrast, when the cell voltage VV4 decreases below 2 Vf, no current flows through the current mirror circuits 80, 81. As a result, the transistor 84 is turned off so that the overdischarging detection circuit 69 outputs a low level signal. Thus, the overdischarging of the cell voltage VV4 can be detected based on the output signal of the overdischarging detection circuit 69. The cell voltages VV1-VV3 can be detected in a similar manner.

Modifications

The embodiments described above may be modified in various ways. For example, the cell voltage monitor circuits 12, 18 may monitor overdischarging instead of overcharging of the cells BC1-BC4 of the assembled battery 3. In this case, the cell voltage monitor circuits 12, 18 are configured such that the monitor signal Sd outputted from the cell voltage monitor circuits 12, 18 becomes the high level when at least one of the cell voltages VV1-VV4 of the cells BC1-BC4. Alternatively, the cell voltage monitor circuits 12, 18 may monitor both overcharging and overdischarging of the cells BC1-BC4 of the assembled battery 3. In this case, each of the cells BC1-BC4 is provided with two comparison circuits 15, and two reference voltages corresponding to upper and lower limit voltages, respectively, of each of the cell voltages VV1-VV4 are generated.

The comparison circuit 15 provided to the cell BC4 arranged on the highest potential side of the assembled battery 3 may be powered by the voltage between the positive and negative terminals of the cell BC 4, and the comparison circuit 15 provided to the cell BCi may be powered by the voltage between the positive terminal of the cell BCi+1 and the negative terminal of the cell BCi, where i is an integer from 1 to 3. In this case, the current compensation circuit 39 is connected between the input terminals T1, T0 of the cell BC1, which is arranged on the lowest potential side of the assembled battery 3.

The comparison circuit 15 provided to the cell BCi may be powered by a voltage between a first one of the input terminals T0-T4 and a second one of the input terminals T0-T4. The first one of the input terminals T0-T4 is connected to the positive terminal, the voltage of which is equal to or greater than a voltage of the positive terminal of the cell BCi. The second one of the input terminals T0-T4 is connected to the negative terminal, the voltage of which is equal to or less than a voltage of the negative terminal of the cell BCi.

The switches 16-18, 22, and 40, and the drive circuit 29 may be eliminated. One cell group of the assembled battery 3 may be constructed with three or less cells, or five or more cells (e.g., eight or ten).

The reference voltage generation circuit 14 may generate the reference voltage Vr without a bandgap reference circuit. A value of the reference voltage Vr may vary according to the cells B1-B4.

In the IC shown in FIG. 7, like the third embodiment, each circuit forming region, where elements operating with respect to the same potential are formed, may be doubly electrically isolated by the trenches. In the fifth embodiment, while the voltage division ratio of the cell voltage detection circuit 13 may be kept constant, the reference voltage generation circuit 14 may generate a first reference voltage during a first period of time when the clock signal CLKIN is at the low level and a second reference voltage during a second period of time when the clock signal CLKIN is at the high level.

Such changes and modifications are to be understood as being within the scope of the present invention as defined by the appended claims.

What is claimed is:

1. A semiconductor integrated circuit device comprising:
a supporting substrate;
a semiconductor layer disposed on the supporting substrate and electrically isolated from the supporting substrate;
a plurality of input terminals connected to positive and negative terminals of a plurality of secondary cells, which are connected in series to construct an assembled battery; and
a plurality of circuit elements formed to the semiconductor layer and electrically isolated from each other,
wherein the plurality of circuit elements provide a plurality of monitor circuits, each monitor circuit being provided to a corresponding one of the plurality of secondary cells to monitor a cell voltage of the corresponding secondary cell,
wherein each monitor circuit includes a cell voltage detection circuit, a reference voltage generation circuit, and a comparison circuit,
wherein the cell voltage detection circuit divides a voltage between the input terminals connected to the positive and negative terminals of the corresponding secondary cell and detects the cell voltage based on the divided voltage,
wherein the reference voltage generation circuit generates a reference voltage from the cell voltage,
wherein the comparison circuit compares the divided voltage with the reference voltage and outputs a first monitor signal in accordance with a result of the comparison, and
wherein the comparison circuit is powered by a voltage between the input terminals connected to a first one of the positive terminals of the plurality of secondary cells and a first one of the negative terminals of the plurality of secondary cells, a voltage of the first one of the positive terminals being equal to or greater than a voltage of the positive terminal of the corresponding secondary cell, a voltage of the first one of the negative terminals being equal to or less than a voltage of the negative terminal of the corresponding secondary cell,
wherein the plurality of circuit elements further provide first, second, and third switch circuits,
wherein the first switch circuit and the cell voltage detection circuit are connected in series between power supply lines of the monitor circuit,
wherein the second switch circuit and the reference voltage generation circuit are connected in series between the power supply lines,
wherein the third switch circuit and the comparison circuit are connected in series between the power supply lines, and
wherein all the first, second, and the third switch circuits are turned on/off at a same timing in accordance with a common on/off signal.

2. A semiconductor integrated circuit device comprising:
a supporting substrate;
a semiconductor layer disposed on the supporting substrate and electrically isolated from the supporting substrate;
a plurality of input terminals connected to positive and negative terminals of a plurality of secondary cells, which are connected in series to construct an assembled battery; and
a plurality of circuit elements formed to the semiconductor layer and electrically isolated from each other,
wherein the plurality of circuit elements provide a plurality of monitor circuits, each monitor circuit being provided to a corresponding one of the plurality of secondary cells to monitor a cell voltage of the corresponding secondary cell,
wherein each monitor circuit includes a cell voltage detection circuit, a reference voltage generation circuit, and a comparison circuit,
wherein the cell voltage detection circuit divides a voltage between the input terminals connected to the positive and negative terminals of the corresponding secondary cell and detects the cell voltage based on the divided voltage,
wherein the reference voltage generation circuit generates a reference voltage from the cell voltage,
wherein the comparison circuit compares the divided voltage with the reference voltage and outputs a first monitor signal in accordance with a result of the comparison, and
wherein the comparison circuit is powered by a voltage between the input terminals connected to a first one of the positive terminals of the plurality of secondary cells and a first one of the negative terminals of the plurality of secondary cells, a voltage of the first one of the positive terminals being equal to or greater than a voltage of the positive terminal of the corresponding secondary cell, a voltage of the first one of the negative terminals being equal to or less than a voltage of the negative terminal of the corresponding secondary cell,
wherein the plurality of circuit elements further provides a current compensation circuit connected between the input terminals connected to the positive and negative terminals of the secondary cell arranged on the highest potential side of the assembled battery,
wherein the compensation circuit outputting an electric current approximately equal to an operating current of the comparison circuit,
wherein the comparison circuit provided to the secondary cell arranged on the lowest potential side of the assembled battery is powered by a voltage between the input terminals connected to the positive and negative terminals of the corresponding secondary cell, and
wherein each of the comparison circuits provided to the secondary cells other than the secondary cell arranged on the lowest potential side is powered by a voltage between the input terminal connected to the positive terminal of the corresponding secondary cell and the input terminal connected to the negative terminal of the secondary cell that is arranged adjacent to the corresponding secondary cell on the lower side of the assembled battery.

3. The device according to claim 2, wherein
wherein the cell voltage detection circuit and the reference voltage generation circuit of a third one of the plurality of the monitor circuits are formed to a third region of the semiconductor layer,
wherein the comparison circuit of the third one of the plurality of the monitor circuits is formed to a fourth region of the semiconductor,
wherein the cell voltage detection circuit and the reference voltage generation circuit of a fourth one of the plurality of the monitor circuits are formed to a fifth region of the semiconductor layer,
wherein the comparison circuit of the fourth one of the plurality of the monitor circuits is formed to a sixth region of the semiconductor layer, and
wherein the third, fourth, fifth, and sixth regions of the semiconductor layer are electrically isolated from each other.

4. A semiconductor integrated circuit device comprising:
a supporting substrate;
a semiconductor layer disposed on the supporting substrate and electrically isolated from the supporting substrate;
a plurality of input terminals connected to positive and negative terminals of a plurality of secondary cells, which are connected in series to construct an assembled battery; and
a plurality of circuit elements formed to the semiconductor layer and electrically isolated from each other,
wherein the plurality of circuit elements provide a plurality of monitor circuits, each monitor circuit being provided to a corresponding one of the plurality of secondary cells to monitor a cell voltage of the corresponding secondary cell,
wherein each monitor circuit includes a cell voltage detection circuit, a reference voltage generation circuit, and a comparison circuit,
wherein the cell voltage detection circuit divides a voltage between the input terminals connected to the positive and negative terminals of the corresponding secondary cell and detects the cell voltage based on the divided voltage,
wherein the reference voltage generation circuit generates a reference voltage from the cell voltage,
wherein the comparison circuit compares the divided voltage with the reference voltage and outputs a first monitor signal in accordance with a result of the comparison, and
wherein the comparison circuit is powered by a voltage between the input terminals connected to a first one of the positive terminals of the plurality of secondary cells and a first one of the negative terminals of the plurality of secondary cells, a voltage of the first one of the positive terminals being equal to or greater than a voltage of the positive terminal of the corresponding secondary cell, a voltage of the first one of the negative terminals being equal to or less than a voltage of the negative terminal of the corresponding secondary cell,
wherein the plurality of circuit elements further provides a monitor signal generation circuit that generates a second monitor signal based on the first monitor signals outputted from the comparison circuits of the plurality of the monitor circuits,
wherein the second monitor signal indicates that a cell voltage of at least one of the plurality of secondary cells is outside a rated voltage range,
the device further comprising:
a clock signal input terminal for receiving a clock signal varying between a first level and a second level;
a clock signal output terminal for outputting the clock signal;
a monitor signal input terminal for receiving the second monitor signal; and
a monitor signal output terminal for outputting the second monitor signal,
wherein the second monitor signal varies between the first level and the second level,
wherein the plurality of circuit elements further provide an output circuit that transmits the clock signal received by the clock signal input terminal to the clock signal output terminal,
wherein the cell voltage detection circuit divides the cell voltage by a first division ratio during a first period of time when the clock signal is at the first level and divides the cell voltage by a second division ratio during a second period of time when the clock signal is at the second level,
wherein during the first period of time, the monitor signal generation circuit outputs the second monitor signal of the first level through the monitor signal output terminal, when at least one of the first monitor signals indicates that the divided cell voltage is less than the reference voltage, and the monitor signal input terminal receives the monitor signal of the first level, and
wherein during the second period of time, the monitor signal generation circuit outputs the second monitor signal of the second level through the monitor signal output terminal, when at least one of the first monitor signals indicates that the divided cell voltage is greater than the reference voltage, and the monitor signal input terminal receives the monitor signal of the second level.

5. A semiconductor integrated circuit device, comprising:
a supporting substrate;
a semiconductor layer disposed on the supporting substrate and electrically isolated from the supporting substrate;
a plurality of input terminals connected to positive and negative terminals of a plurality of secondary cells, which are connected in series to construct an assembled battery; and
a plurality of circuit elements formed to the semiconductor layer and electrically isolated from each other,
wherein the plurality of circuit elements provide a plurality of monitor circuits, each monitor circuit being provided to a corresponding one of the plurality of secondary cells to monitor a cell voltage of the corresponding secondary cell,
wherein each monitor circuit includes a cell voltage detection circuit, a reference voltage generation circuit, and a comparison circuit,
wherein the cell voltage detection circuit divides a voltage between the input terminals connected to the positive and negative terminals of the corresponding secondary cell and detects the cell voltage based on the divided voltage,
wherein the reference voltage generation circuit generates a reference voltage from the cell voltage,
wherein the comparison circuit compares the divided voltage with the reference voltage and outputs a first monitor signal in accordance with a result of the comparison, and
wherein the comparison circuit is powered by a voltage between the input terminals connected to a first one of the positive terminals of the plurality of secondary cells and a first one of the negative terminals of the plurality of secondary cells, a voltage of the first one of the positive terminals being equal to or greater than a voltage of the positive terminal of the corresponding secondary cell, a voltage of the first one of the negative terminals being equal to or less than a voltage of the negative terminal of the corresponding secondary cell, wherein the plurality of circuit elements further provide at least one of first, second, and third switch circuits, wherein when the plurality of circuit elements further provide the first switch circuit, the first switch circuit and the cell voltage detection circuit are connected in series between power supply lines of the monitor circuit, wherein when the plurality of circuit elements further provide the second switch circuit, the second switch circuit and the reference voltage generation circuit are connected in series between the power supply lines, wherein when the plurality of circuit elements further provide the third switch circuit, the third switch circuit and the comparison circuit are connected in series between the power supply lines, and wherein all the at least one of the first, second, and the third switch circuits are turned on/off at a same timing in accordance with a common on/off signal.

* * * * *